United States Patent [19]

Sliwkowski et al.

[11] Patent Number: 4,768,154

[45] Date of Patent: Aug. 30, 1988

[54] COMPUTER AIDED PRINTED CIRCUIT BOARD WIRING

[75] Inventors: Joseph Sliwkowski, Sudbury; Robert Fisher, Chelmsford, both of Mass.

[73] Assignee: Telesis Systems Corporation, Chelmsford, Mass.

[21] Appl. No.: 47,986

[22] Filed: May 8, 1987

[51] Int. Cl.$^4$ .............................................. G06F 15/60
[52] U.S. Cl. ...................................... 364/468; 364/491
[58] Field of Search ....................... 364/468, 488–491, 364/194, 300, 148

[56] References Cited

U.S. PATENT DOCUMENTS

| | | | |
|---|---|---|---|
| 4,437,603 | 3/1984 | Kobayashi et al. | 228/4.5 |
| 4,484,292 | 11/1984 | Hong et al. | 364/491 |
| 4,615,011 | 9/1986 | Linsker | 364/468 |

Primary Examiner—Jerry Smith
Assistant Examiner—Allen MacDonald
Attorney, Agent, or Firm—Weingarten, Schurgin, Gagnebin & Hayes

[57] ABSTRACT

Method and apparatus for computer aided completion of the interconnection pattern of a printed circuit board left after an automatic interconnect routing system fails to connect all points needing connection. The invention utilizes operator and/or automatic intervention in combination with system provided indicia representative of regions, about each of a set of points to be interconnected on the board, where conductors can be placed according to predesignated interconnect protocols or constraints. The system provides selectable logical operations on the regions that permit operator display of indicia from which the operator can intervene to complete the interconnection by providing a minimal sacrifice of protocols or through automatic intervention to complete the interconnect pattern between points in each region according to a data base of acceptable protocol modifications. A list of sets of points which failed to be connected by the automatic router is prioritized to permit the system to take up each unconnected set of points for completion in an order that optimizes efficiency or success likelihood. The interconnect completion system can be utilized on part or all of a printed circuit board wiring project in order to improve overall interconnect efficiency or cost minimization without regard to whether or not automatic routing would provide a connection between points.

40 Claims, 2 Drawing Sheets

COMPUTER AIDED PRINTED CIRCUIT BOARD WIRING

FIELD AND BACKGROUND OF THE INVENTION

In the computer aided design of printed circuit boards the pattern of conductor or interconnect between points to be wired together through one or more layers is typically accomplished using an automated routing or "maze runner" algorithm. Such a system builds an expanding data base or map of available locations where conductor pattern may be run from one of the points of the set of points to be connected until the map of available locations expands to include the other point (or points) of that set. Various algorithmic processing techniques are available commercially to accomplish this function. In order to insure that certain printed circuit board criteria are met, the automated routing systems will operate according to an interconnect protocol which specifies certain constraints upon the conductor pattern between points, such as minimal conductor size, minimal conductor spacing, number of acceptable vias, or layer to layer connection paths, and total conductor length. These protocols may be global to the entire printed circuit board or vary with each set of points to be interconnected. As typically happens, particularly in the design of complex, multi-layered circuit boards, after automated routing has processed the entire list of sets of points to be interconnected, several sets will have been found not possible to interconnect utilizing the automated routing system under the protocols provided for that printed circuit board.

Once the list of sets of points that cannot be automatically interconnected is established, a human operator must take over the task of manually interconnecting those sets of points. It should be noted that it is a very time consuming and frustrating process for an operator to manually interconnect the sets of points which were left by the automatic routing system.

BRIEF SUMMARY OF THE INVENTION

In accordance with the teaching of the present invention, the task of manually completing the interconnection of sets of points left by an automatic printed circuit board routing system is accomplished in the system of the invention by providing to the operator indicia representative of regions on the printed circuit board to which conductor can be run, according to the interconnect protocols, from each point of the set of points that were unsuccessfully connected by the automatic routing system. Logical operations are performed on the regions in order to simplify the operator's task in identifying an interconnect scheme which provides a minimal interruption of the interconnect protocols. In typical applications, such logical operations include the display of one or the other of the regions about a given point in the set of unconnected points, a display of the logical AND between such regions, a display of possible jumper wire locations between such regions, a logical OR function of the regions, or indicia of points of closest approach between locations in the regions about each of the points in the unconnected set. Such information provided to the operator simplifies the operators task in devising a final interconnect strategy utilizing, for example, one or more violations of the protocol such as increasing the number of vias or using a point to point jumper wire, or by relaxing the protocol applicable to already completed interconnects in order to make room for the additional conductor to connect the designated points.

A data base is additionally provided containing a prioritized relaxation of protocols which can be automatically applied to unconnected points, or previously connected points, based upon logical operations on the regions about each point that will permit automated completion of the wiring at acceptable compromise of board performance.

The list of sets of unconnected points is prioritized as to the order for interconnect completion in order to improve the efficiency and minimize the performance cost resulting from forced completion of the interconnections between points. For example, the prioritization typically would identify for first completion the points which appear to be the farthest apart or most difficult, with minimal or no overlap in their regions.

Because the system provides interconnect completion with minimal cost to board performance, it may be utilized to process an entire board interconnection list, or a significant portion of it, regardless of whether automated routing would or would not provide completion of some of those points, in order to permit operator preadjustment of the automated wiring system that will result in an overall minimization of unconnected points and/or the performance cost of completing points unconnected by automated routing.

BRIEF DESCRIPTION OF THE DRAWING

These and other features of the present invention are more fully set forth below in the solely exemplary detailed description and accompanying drawing of which.

DETAILED DESCRIPTION

The present invention contemplates a system for facilitating completion of interconnects between points of a set of points to be interconnected on a printed circuit board by providing to the operator indicia representative of regions to which conductor may be applied on the printed circuit board from each of the points to be interconnected.

Figure 1:
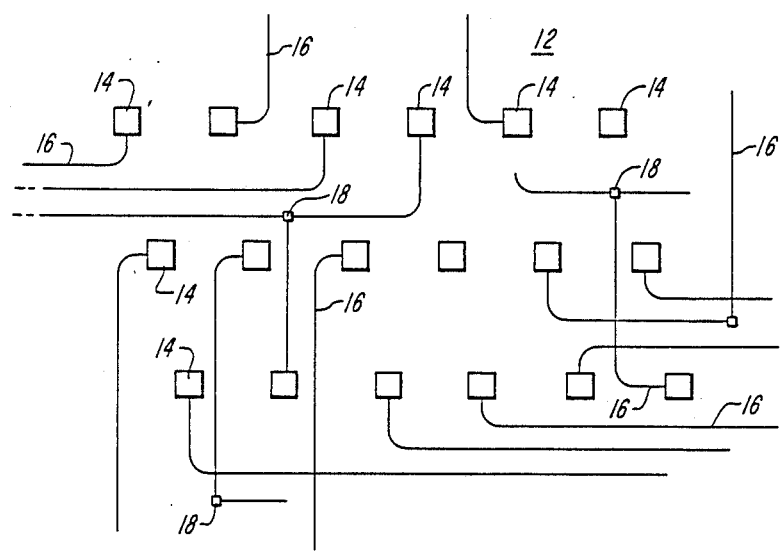
FIG. 1 is a diagram of typical points on a printed circuit board and interconnecting conductor patterns on a plurality of board layers.

With respect to FIG. 1 there is shown a segment of a printed circuit board generally designated as 12 on which a plurality of terminals or contacts 14 are located. These typically represent electrical connections to which integrated circuits or other electrical components are connected. Designated sets of the terminals 14 are to be electrically interconnected by a pattern of conductor 16. The printed circuit board 12 is typically a multi-layered board and according to normal convention, conductor on one layer will run in one direction such as east and west, or horizontally in the view of FIG. 1, while conductor on an adjacent layer will run north and south, or vertically in the view of FIG. 1. Interconnection between layers of the board is typically provided through vias 18 which, in complex boards, are normally essential in order to permit interconnection from one location on a board to another due to the necessary crossing of conductors.

Figure 2:
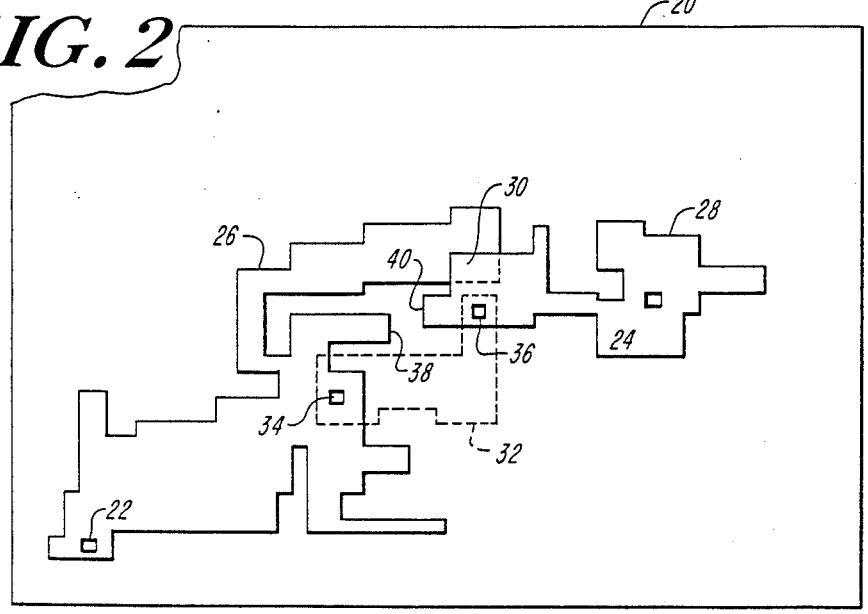
FIG. 2 is a diagram of regions exemplifying places to which a continuous conductor pattern can be routed from respective points of a set of two points which are to be connected.

FIG. 2 illustrates on a smaller scale an entire printed circuit board 20, having two terminal points 22 and 24 which are to be interconnected. Processing according to the invention will develop first and second regions 26 and 28, representing the locations on a single layer of the multi-layer board 20 to which a pattern of conductor from the corresponding points 22 and 24 may be run, in the presence of other known interconnections on the board. Where the board 20 is a multi-layer board, a set of regions corresponding to, but differently placed from the regions 26 and 28 can be developed from various locations on each of the layers, the locations on the different layers, layers other than those containing the terminals 22 and 24, could be developed about vias placed between layers to provide connection to regions 26 and 28. In this manner an operator, given information corresponding to that displayed in FIG. 2, can develop an interconnect pattern between the points 22 and 24 with or without the capability of an automatic routing system. For example, in the case where the regions 26 and 28 overlap as in a region 30 an interconnection between points 22 and 24 is possible through the use of a single via between the layers in the region 30. In other cases, a region 32 of possible conductor on a further layer is used with vias 34 and 36 into the regions 26 and 28 respectively to complete the connection. In other cases, the operator will adjust previously completed conductor patterns, in acceptable violation of protocols used to establish those patterns, in order to free up a present connection, for example, between points of close approach 38 and 40 in the regions 26 and 28.

Typically the information displayed will be a portion of that represented by FIG. 2, such as a single region, a layer at a time, or a representation of the logical AND of the regions 26 and 28, represented by the overlap region 30. Other logical operations include the logical OR of the regions 26 and 28, indication of the points of closest approach between the regions 26 and 28, and/or an indication according to certain interconnection protocols, where jumper wiring between locations in the regions 26 and 28 may be achieved at minimal board performance sacrifice. Any Boolean function may be performed on the data representing the regions. The operator is then provided with the results of that operation, information that greatly reduces his or her task in completing the interconnection of points. Other examples of the mapping of regions are shown in FIGS. 5, 6 and 7 where like numerals represent like features.

Figures 3, 4:
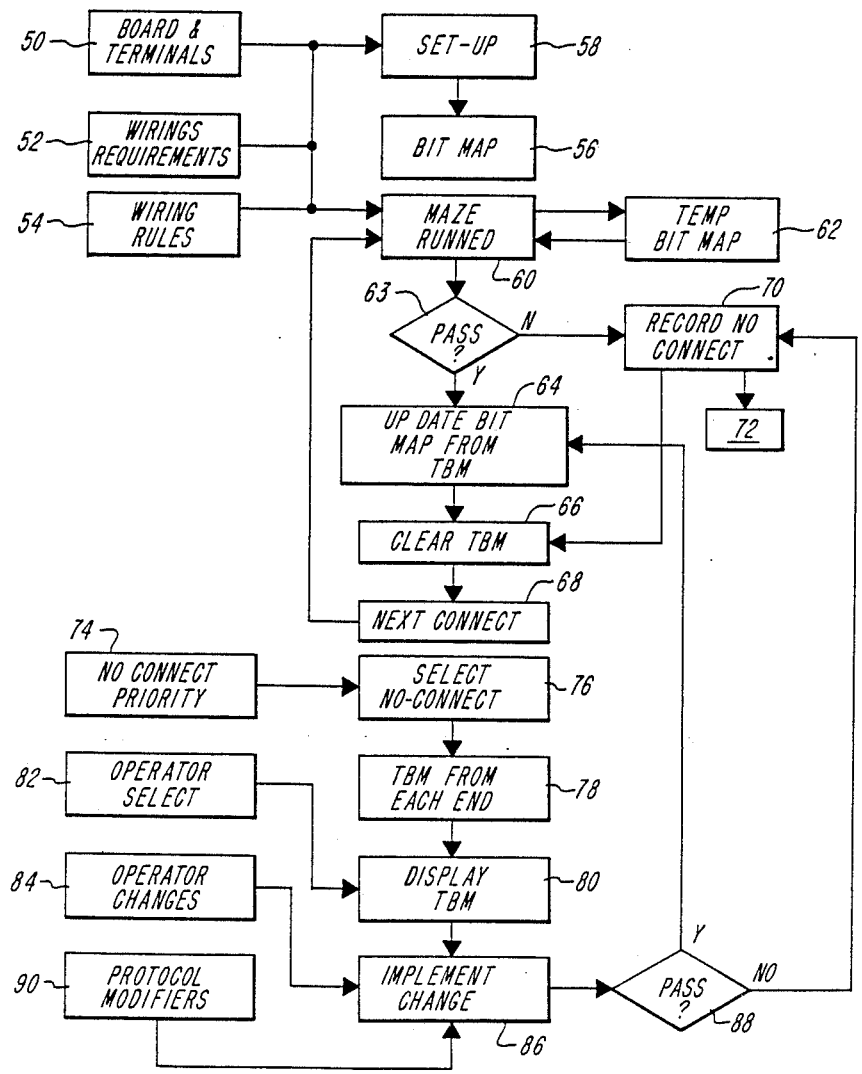
FIG. 3 is a block diagram of computer aided design processing utilizing operator intervention for connection completion according to the present invention.
FIG. 4 is diagrammatic, pictorial view of a typical computer aided design workstation on which the present invention is operative.

There is illustrated in FIG. 3 computer aided design terminal processing according to the present invention, typically useful on a computer aided design terminal 44 of the type illustrated in FIG. 4 and having an operator keyboard 46 and display screen 48, with internal graphics, graphics processors, associated memory and software. The processing of FIG. 3 utilizes a set of data bases 50, 52 and 54 which are set up, according to known rules of printed circuit board design, in order to identify respectively the presence of terminals and their position on the printed circuit board and dimensional data pertinent thereto, the interconnection requirements between the terminals, typically constituting a list of points which are to be interconnected, and a set of interconnection rules or protocols which constrain the manner in which conductors may be routed between points or terminals. Typically the protocols identify the size of the conductors on the boards with their width or cross-sectional area, the spacing required between conductors, the number of vias or interconnects between board layers permitted according to the protocol, the total length of conductors allowed between points or terminals. The protocol may be global and applicable to all sets of points to be connected or may vary with each set of points to be connected. Typically the protocols are established by the design engineers to accommodate certain current density requirements, and to minimize interference, capacitive, inductive or radiative effects, all as are known in the art.

From these data bases a bit map 56 is initially constructed, having the board dimensions and the terminal locations thereon as provided through a set-up routine 58 as is known in the art. "Maze runner" or automatic routing software, a commercially available entity, such as provided by the Redac Company for use on the Visula terminal, is then operative in a step 60 in accordance with the interconnection requirements and protocols in data bases 52 and 54 and the bit interconnect pattern built on the map 56 point set by point set. The automated connection routine in step 60 typically takes each set of points to be interconnected, according to some sequential order, and develops about one or the other of the points a locus of points to which conductor can be routed, under the protocols of database 54, until that locus has expanded to include the other point in the set to be connected. The expanding locus is maintained as a temporary bit map 62 within the memory of the terminal 44. Once the locus in the bit map 62 has expanded to incorporate the two points in the set, the "maze runner" 60 then establishes a specific conductor route through that locus in the temporary bit map 62, according to the protocols.

Processing at this point will pass through a decision step 62 which determines whether or not the automated routing was able to complete the connection between points in the set according to the just described procedure or, if after a predetermined number of efforts, or length of time, it was incapable of completing the connection. Typically the decision 62 will be activated as soon as the locus expands to include both points or the time interval passes. Assuming that the automated routing was able to establish a locus large enough to incorporate both points, processing proceeds through a step 64 which adds to the bit map 56 the just completed conductor pattern from the temporary bit map 62. A subsequent step 66 clears the temporary map 62 and proceeds through a step 68 which selects the next set of points to be interconnected and returns to the "maze runner" step 60 for operation on that set.

If the automated routing system in step 60 had failed to complete a connection, the decision step 62 would pass control to a step 70 which places that set of points into a list or record of sets of unconnected points. Step 70 then passes control back to step 66 which clears the temporary bit map 62 and continues processing as before. As an alternative, step 70 may place the data in the temporary bit map 62 into a central storage file 72 to speed later processing of the unconnected sets.

Once the entire set of interconnection requirements in the data base 52 has been processed, the system will typically operate on the record of sets of unconnected points established in various passes through step 70.

Preferably, the system will process the list through a prioritization step 74 which establishes the order in which the sets of unconnected points are processed. The priority scheme selects for first processing those sets which appear to be the most difficult to interconnect as determined by the least amount of overlap, farthest distance of closest approach, or other such criteria. With the prioritization accomplished in step 74, a subsequent step 76 selects the first, or next, set in the prioritization list and establishes a temporary bit map in a step 78 developed from each of the points to be connected. The step 78 establishes the regions, exemplified by the regions 26 and 28 in FIG. 2, about the two points 22 and 24. Step 78 causes the routing step 60 to operate on each point to be connected and thus establishes a separate bit map for each point. A subsequent step 80 provides an operator display of indicia corresponding to the temporary bit maps established in step 78. Typically the display of the temporary bit maps may be operator selected, through processing of an operator keyboard input in selection step 82, to select one or more logical processing operations on the data in the temporary bit maps established in step 78. The logical processing includes processing according to any Boolean function on the data in the temporary bit maps and display of the result. Temporary bit maps for regions about vias to other layers in a multi-layered board, such as the vias 34 or 36 in FIG. 2 can be ordered by the operator. The logic function can be selected to display regions of overlap such as region 30, locations of closest approach between the regions about each point in the temporary bit maps, or the logical OR (including Exclusive OR) of the temporary bit maps.

From this information the operator is given concise data indicating where potential interconnection may be accomplished between the regions of the temporary bit maps to which conductor can be routed with some, but acceptable, violation of the interconnection protocols, either to that specific interconnection or to other interconnections previously established which may accomplish a block to the desired interconnect. In a step 84 the operator, using known commands, provides input to the computer aided design terminal 44 identifying changes in the conductor pattern which sacrifices, acceptably, certain of the interconnection requirements in order to provide the interconnection between the set of points in the unconnected set. In step 86 the design terminal 44 implements that change directly or using the maze runner and other available routing procedures. A subsequent test 88 determines whether that modification will accomplish an interconnection. If the interconnection is accomplished, processing returns to the step 64 to update the bit map with the newly established interconnection. If negative, the step 88 returns processing to the step 70 in which that set of points is retained in the list of unconnected points. Ultimately that unconnected point set may have to be operated on by completely manual intervention but may be reiteratively processed through the steps beginning with step 76 as many times as the operator deems appropriate. After each set of unconnected points is processed in this manner, the next connection step 68 will branch to the step 76 for selection of the next unconnected points in the list.

Alternatively or additionally, a set of designated protocol modification rules in a data base 90 is automatically executed in step 86, in order to minimize operator intervention. A set of acceptable modifications for a set of points which were not automatically connected by the "maze runner" is implemented in order to provide automated connection of an otherwise unconnectable set of points. The modifiers of data base 90 may be interactively developed depending upon the nature of previously obtained interconnections, may be built into the system in advance or may be operator activated once the list of unconnected points is established.

In the manner described above, operator intervention to accomplish interconnection is effective and economically achieved. The above description is intended as exemplary only, it being understood that other forms of processing details may be utilized within the scope of the invention as it is solely defined in the following claims.

We claim:

1. A system for designing printed circuit board conductor patterns comprising:
   means for identifying sets of points between which conductors are to run on said board;
   means for identifying protocols for placing conductors between points of a set;
   means for automatically routing conductors between points of a set;
   means for maintaining a map of the automatically identified conductor routing between points of a set where said routing means is able to succeed in providing a conductor between points according to the protocol;
   means for identifying the sets of points for which said automatic routing means is unsuccessful in providing a conductor between points of a set;
   means for identifying regions to which conductor can be provided from each point of a set of points for which said routing means was unsuccessful in providing a conductor between those points;
   means for providing operator viewable indicia representative of said regions;
   means for providing operator interaction to identify a conductor route between points of a set of points for which said routing means was unsuccessful thereby to complete conductor between the points of said set;
   means for adding to said map the operator identified route between points.

2. The system of claim 1 wherein said means for identifying sets of points to be interconnected includes means for identifying points on one or more layers of a printed circuit board.

3. The system of claim 1 wherein said means for identifying protocols includes means for identifying protocols selected from the group consisting of conductor size, conductor spacing, conductive vias, and conductor length between points.

4. The system of claim 1 wherein:
   said routing means includes means for identifying regions of conductor placement about one point of a set of points to be interconnected until said region incorporates the other point of said set; and
   said means for identifying regions about each point is operative to cause said routing means to develop regions about each point of a set of points.

5. The system of claim 4 wherein said regions are provided as temporary maps of possible conductor placement.

6. The system of claim 1 wherein said means for providing operator viewable indicia includes means operative in response to the identified regions about each point of a set for providing a logical operation thereon.

7. The system of claim 6 wherein said logical operation providing means includes means for displaying a temporary map of regions for a selected one point of said set of points.

8. The system of claim 6 wherein said logical operation providing means includes means for providing the logical AND of the regions about the points of said set of points.

9. The system of claim 6 wherein said logical operation providing means includes means for providing an indication of jumper wire locations between the regions.

10. The system of claim 6 wherein said logical operation providing means includes means for providing a logical OR operation on the regions.

11. The system of claim 6 wherein said logical operation providing means includes means for identifying the closest points of approach for the regions about each point of a set of points.

12. The system of claim 6 wherein said logical operation is a Boolean operation.

13. The system of claim 1 wherein said operator interaction providing means includes means for providing protocol modification.

14. The system of claim 13 wherein said protocol modification providing means includes means automatically operative for identifying protocol modification according to a predetermined scheme to accomplish interconnection between points of a set.

15. The system of claim 1 further including:
means for prioritizing the identified sets of unsuccessful routing; and
said means for identifying regions being operative to identify regions in a sequential order according to said priority of identified sets.

16. A system for designing interconnections for printed circuit boards comprising:
means for identifying regions of possible locations for conductors between points of a set of points to have printed circuit conductors therebetween;
means for providing a logical operation on said identified regions;
means for routing conductors between identified regions in response to said logical operation according to an interconnection protocol.

17. The system of claim 16 wherein said logical operation includes one or more operations selected from the group consisting of displaying one region alone, displaying a logical AND of the regions, displaying a logical OR of said regions, displaying indicia representative of points of closest approach between regions.

18. The system of claim 16 wherein paid protocol includes means for minimizing cost factors in the interconnecting of points.

19. The system of claim 18 wherein said cost factors have costs assigned to conductor size, spacing, vias, and length.

20. The system of claim 16 wherein said logical operation is a Boolean operation.

21. A method for designing printed circuit board conductor patterns comprising:
identifying sets of points between which conductors are to run on said board;
identifying protocols for placing conductors between points of a set;
automatically routing conductors between points of a set;
maintaining a map of the automatically identified conductor routing between points of a set where said routing step is able to succeed in providing a conductor between points according to the protocol;
identifying the sets of points for which said automatic routing step is unsuccessful in providing a conductor between points of a set;
identifying regions to which conductor can be provided from each point of a set of points for which said routing step was unsuccessful in providing a conductor between those points;
providing operator viewable indicia representative of said regions;
providing operator interaction to identify a conductor route between points of a set of points for which said routing step was unsuccessful thereby to complete conductor between the points of said set;
adding to said map the operator identified route between points.

22. The method of claim 21 wherein said step of identifying sets of points to be interconnected includes the step of identifying points on one or more layers of a printed circuit board.

23. The method of claim 21 wherein said step of identifying protocols includes the step of identifying protocols selected from the group consisting of conductor size, conductor spacing, conductive vias, and conductor length between points.

24. The method of claim 21 wherein:
said routing step includes the step of identifying regions of conductor placement about one point of a set of points to be interconnected until said region incorporates the other point of said set; and
said step of identifying regions about each point is operative to cause said routing step to develop regions about each point of a set of points.

25. The method of claim 24 wherein said regions are provided as temporary maps of possible conductor placement.

26. The method of claim 21 wherein said step of providing operator viewable indicia includes the step operative in response to the identified regions about each point of a set, of providing a logical operation thereon.

27. The method of claim 26 wherein said logical operation step includes the step of displaying a temporary map of regions for a selected one point of said set of points.

28. The method of claim 26 wherein said logical operation step includes the step of providing the logical AND of the regions about the points of said set of points.

29. The method of claim 26 wherein said logical operation step includes the step of providing an indication of jumper wire locations between the regions.

30. The method of claim 26 wherein said logical operation step includes the step of providing a logical OR operation on the regions.

31. The method of claim 26 wherein said logical operation step includes the step of identifying the closest points of approach for the regions about each point of a set of points.

32. The method of claim 26 wherein said logical operation is a Boolean operation.

33. The method of claim 21 wherein said operator interaction providing step includes the step of providing protocol modification.

34. The method of claim 33 wherein said protocol modification step includes the step automatically operative, of identifying protocol modification according to a predetermined scheme to accomplish interconnection between points of a set.

35. The method of claim 21 further including the steps of:

prioritizing the identified sets of unsuccessful routing; and said step of identifying regions being operative to identify regions in a sequential order according to said priority of identified sets.

36. A method for designing interconnections for printed circuit boards comprising:

identifying regions of possible locations for conductors between points of a set of points to have printed circuit conductors therebetween;

providing a logical operation on said identified regions;

routing conductors between identified regions in response to said logical operation according to an interconnection protocol.

37. The method of claim 36 wherein said logical operation includes one or more operations selected form the group consisting of displaying one region alone, displaying a logical AND of the regions, displaying a logical OR of said regions, displaying indicia representative of points of closest approach between regions.

38. The method of claim 36 wherein said protocol includes the step of minimizing cost factors in the interconnecting of points.

39. The method of claim 31 wherein said cost factors have costs assigned to conductor size, spacing, vias, and length.

40. The method of claim 36 wherein said logical operation is a Boolean operation.

* * * * *

UNITED STATES PATENT AND TRADEMARK OFFICE
CERTIFICATE OF CORRECTION

PATENT NO.  : 4,768,154

DATED       : August 30, 1988

INVENTOR(S) : Joseph Sliwkowski; Robert Fisher

It is certified that error appears in the above-identified patent and that said Letters Patent is hereby corrected as shown below:

Column 7, line 53,    "paid" should read --said--

Column 10, line 15,   "39. The method of claim 31" should read --39. The method of claim 38--

Signed and Sealed this

Seventh Day of November, 1989

Attest:

JEFFREY M. SAMUELS

*Attesting Officer*   *Acting Commissioner of Patents and Trademarks*